(12) United States Patent
Xie et al.

(10) Patent No.: US 10,439,031 B2
(45) Date of Patent: Oct. 8, 2019

(54) INTEGRATION OF VERTICAL-TRANSPORT TRANSISTORS AND ELECTRICAL FUSES

(71) Applicant: GLOBALFOUNDRIES Inc., Grand Cayman (KY)

(72) Inventors: Ruilong Xie, Schenectady, NY (US); Kangguo Cheng, Schenectady, NY (US); Tenko Yamashita, Schenectady, NY (US); Chun-chen Yeh, Danbury, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/338,925

(22) Filed: Oct. 31, 2016

(65) Prior Publication Data

US 2018/0122913 A1    May 3, 2018

(51) Int. Cl.

| | |
|---|---|
| *H01L 23/525* | (2006.01) |
| *H01L 27/112* | (2006.01) |
| *H01L 29/417* | (2006.01) |
| *H01L 29/06* | (2006.01) |
| *H01L 29/78* | (2006.01) |
| *H01L 29/66* | (2006.01) |
| *H01L 21/762* | (2006.01) |

(52) U.S. Cl.
CPC .. *H01L 29/41791* (2013.01); *H01L 21/76224* (2013.01); *H01L 23/5256* (2013.01); *H01L 29/0649* (2013.01); *H01L 29/0676* (2013.01); *H01L 29/66795* (2013.01); *H01L 29/785* (2013.01)

(58) Field of Classification Search
CPC .................................................. H01L 23/5256
See application file for complete search history.

(56) References Cited

U.S. PATENT DOCUMENTS

| | | | | |
|---|---|---|---|---|
| 2009/0040006 | A1* | 2/2009 | Chidambarrao | G11C 17/16 337/227 |
| 2017/0345829 | A1* | 11/2017 | Balakrishnan | H01L 27/11206 |

* cited by examiner

*Primary Examiner* — Moazzam Hossain
*Assistant Examiner* — Hajar Kolahdouzan
(74) *Attorney, Agent, or Firm* — Thompson Hine LLP; Anthony Canale

(57) ABSTRACT

Structures for a vertical-transport field-effect transistor and an electrical fuse integrated into an integrated circuit, and methods of fabricating a vertical-transport field-effect transistor and an electrical fuse integrated into an integrated circuit. A doped semiconductor layer that includes a first region with a first electrode of the vertical electrical fuse and a second region with a first source/drain region of the vertical-transport field effect transistor. A semiconductor fin is formed on the first region of the doped semiconductor layer, and a fuse link is formed on the second region of the doped semiconductor layer. A second source/drain region is formed that is coupled with the fin. A gate structure is arranged vertically between the first source/drain region and the second source/drain region. A second electrode of the vertical fuse is formed such that the fuse link is arranged vertically between the first electrode and the second electrode.

20 Claims, 7 Drawing Sheets

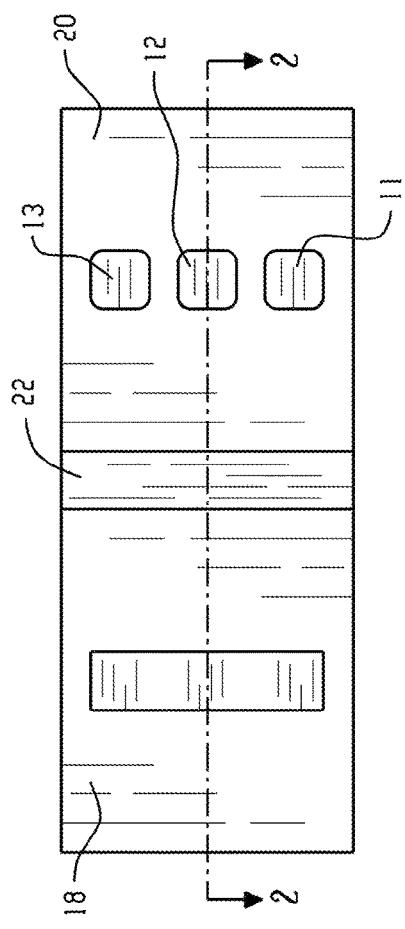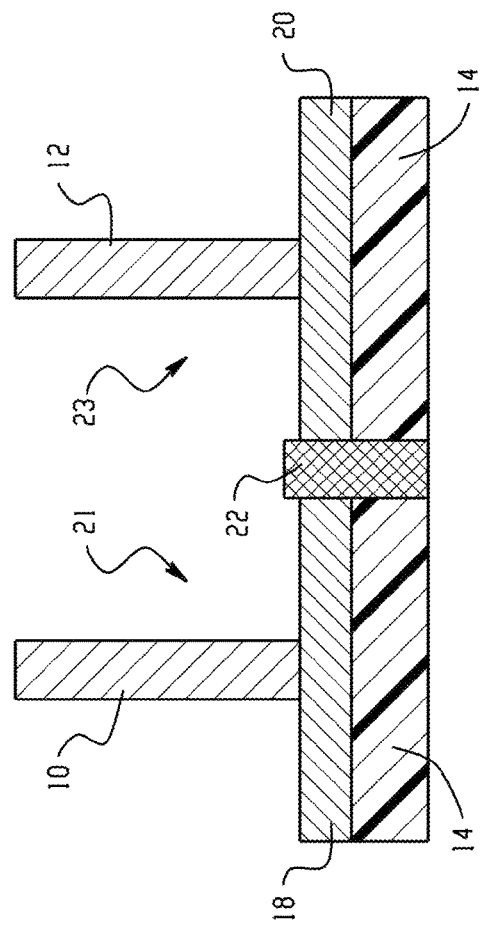

INTEGRATION OF VERTICAL-TRANSPORT TRANSISTORS AND ELECTRICAL FUSES

BACKGROUND

The present invention relates to semiconductor device fabrication and integrated circuits and, more specifically, to structures for the integration of a vertical-transport field-effect transistor and an electrical fuse into an integrated circuit, as well as methods of integrating a vertical-transport field-effect transistor and an electrical fuse into an integrated circuit.

Traditional transistor structures include a source, a drain, a channel situated between the source and drain, and a gate electrode configured to respond to a gate voltage by selectively connecting the source and drain to each other through the channel. Transistor structures are formed on a surface of a semiconductor substrate, which surface may be considered to be contained in a horizontal plane. Transistor structures can be broadly categorized based upon the orientation of the channel relative to the surface of the semiconductor substrate.

Planar transistors constitute a category of transistor structures in which the channels are oriented parallel to the substrate surface. Vertical transistors represent a different category of transistor structures in which the channels are aligned vertical to the substrate surface. Because the gated current between the source and drain is directed through the channel, different types of vertical transistors, namely fin-type field-effect transistors (FinFETs), and vertical-transport field-effect transistors, can also be distinguished from each another based upon the direction of current flow. A FinFET has a horizontal channel in which the direction of the gated current flow between the source and drain of a FinFET-type vertical transistor is generally parallel (i.e., horizontal) to the substrate surface. In contrast, the direction of the gated current flow in the vertical channel between the source and drain in a vertical-transport field-effect transistor is generally perpendicular (i.e., vertical) to the substrate surface.

An electrical fuse may include an anode, a cathode, and a fuse link connecting the anode and cathode. An electrical fuse, which is initially a closed circuit at the time of its fabrication, may be dynamically programmed in real time by passing an electrical current of relatively high current density through the fuse link. Generally, the electrical resistance of the programmed electrical fuse is larger and, in most instances, significantly larger than the electrical resistance of the intact electrical fuse.

Improved structures and fabrication methods are needed that integrate a vertical-transport field-effect transistor and a fuse in an integrated circuit.

SUMMARY

According to an embodiment, a structure includes a vertical-transport field-effect transistor having a fin, a gate structure overlapping a vertical channel of the fin, a first source/drain region, and a second source/drain region. The gate structure is arranged vertically between the first source/drain region and the second source/drain region. The structure further includes a vertical electrical fuse having a fuse link, a first electrode, and a second electrode connected by the fuse link with the first electrode. The fuse link is arranged in the vertical direction between the first electrode and the second electrode.

According to another embodiment, a method includes forming a doped semiconductor layer that includes a first region comprising a first electrode of a vertical electrical fuse and a second region comprising a first source/drain region of a vertical-transport field effect transistor, forming a fin on the first region of the doped semiconductor layer, and forming a fuse link on the second region of the doped semiconductor layer. A gate structure is formed that overlaps a vertical channel of the fin. A second source/drain region is formed that is coupled with the fin such that the gate structure is arranged in a vertical direction between the first source/drain region and the second source/drain region. A second electrode of the vertical electrical fuse is formed such that the fuse link is arranged in the vertical direction between the first electrode and the second electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1 is a top view of a structure at an initial stage of a processing method in accordance with embodiments of the invention.

FIG. 2 is a cross-sectional view taken generally along line 2-2 in FIG. 1.

DETAILED DESCRIPTION

Figure 3:
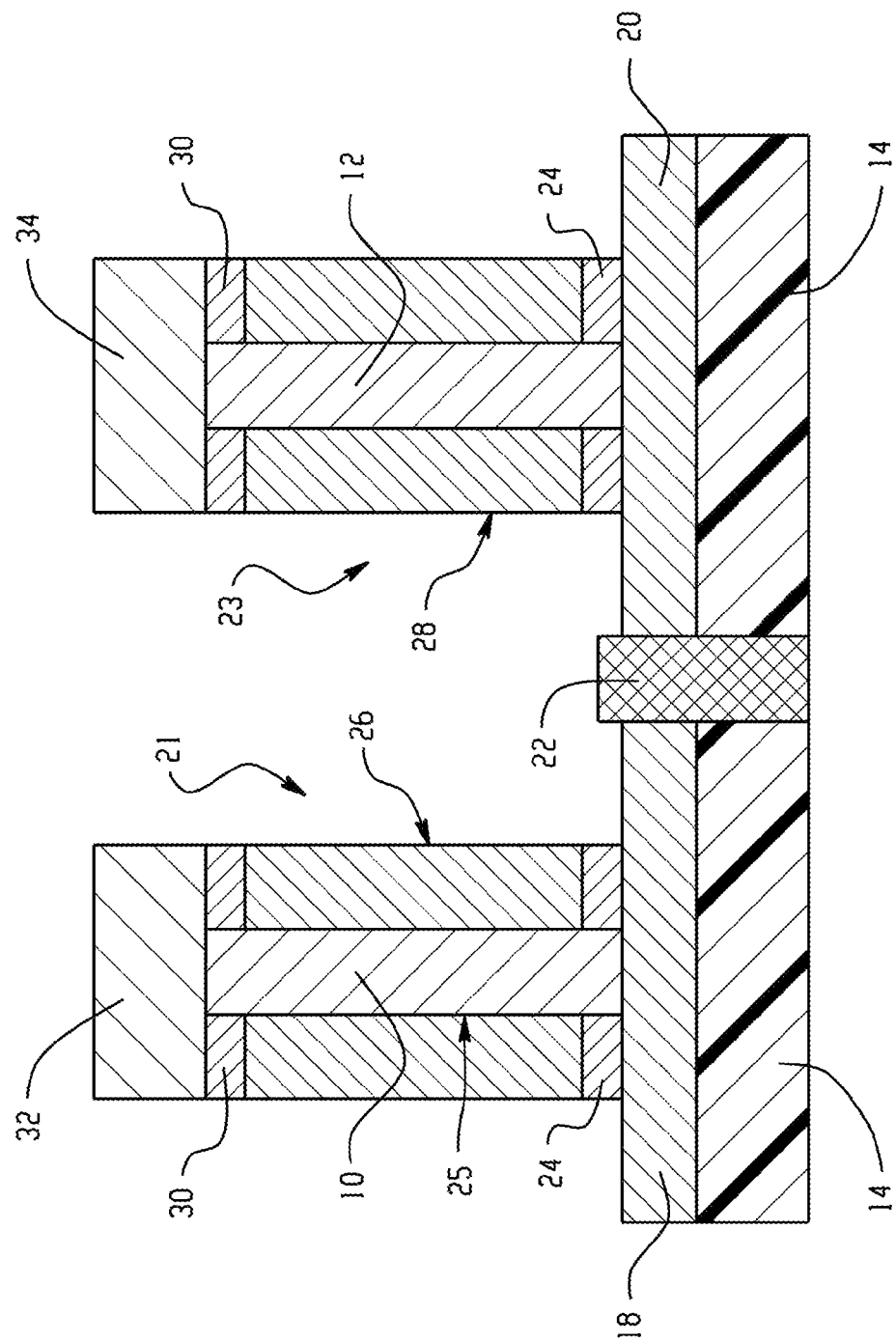
FIGS. 3-8 are cross-sectional views of the structure of FIGS. 1, 2 at successive subsequent fabrication stages of the processing method.

With reference to FIGS. 1, 2 and in accordance with an embodiment of the invention, a fin 10 and pillars 11, 12, 13 may be located on a substrate 14, which may be a bulk silicon substrate or a silicon device layer of a semiconductor-on-insulator (SOI) substrate. The fin 10 and the pillars 12 may be three-dimensional bodies comprised of a semiconductor material, such as silicon, and are project in a vertical direction relative to the top surface of the substrate 14.

A region 18 of a doped semiconductor layer is located between the fin 10 and the substrate 14, a region 20 of a doped semiconductor layer is located between the pillar 12 and the substrate 14. The region 18 of the doped semiconductor layer is coupled with a bottom surface of the fin 10, and the region 20 of the doped semiconductor layer is coupled with one end of the pillar 12. The doped semiconductor layer comprising the regions 18, 20 may be formed from an epitaxial layer of semiconductor material deposited by an epitaxial growth process on the substrate 14 with in-situ doping, and may include a concentration of an n-type dopant from Group V of the Periodic Table (e.g., phosphorus (P) or arsenic (As)) that is effective to impart n-type electrical conductivity. Alternatively, the semiconductor material of the doped semiconductor layer comprising the regions 18, 20 may include a concentration of a p-type dopant selected from Group III of the Periodic Table (e.g., boron (B)) that is effective to impart p-type conductivity.

The region 18 of the doped semiconductor layer may include a bottom source/drain region of a vertical-transport field-effect transistor formed using the fin 10, and the region 20 of the doped semiconductor layer may include a bottom electrode of a vertical fuse formed using the pillar 12. As used herein, the term "source/drain region" means a doped region of semiconductor material that can function as either a source or a drain of a field-effect transistor, and the term "electrode" means either an anode or a cathode of an electrical fuse.

A trench isolation region 22 laterally separates the region 18 of the doped semiconductor layer from the region 20 of the doped semiconductor layer along their juncture. The trench isolation region 22 may be formed by a shallow trench isolation (STI) technique that relies on photolithography and reactive ion etching to define trenches in the semiconductor layer and the substrate 14, deposits a dielectric material to fill the trenches, and planarizes the dielectric material relative to the top surface of the doped semiconductor layer using, for example, chemical mechanical polishing (CMP). The dielectric material comprising the trench isolation region 22 may be an oxide of silicon (e.g., silicon dioxide ($SiO_2$)) or another electrical insulator deposited by chemical vapor deposition (CVD). The trench isolation region 22 electrically isolates the region 18 of the doped semiconductor layer from the region 20 of the doped semiconductor layer, and serves to demarcate a transistor region 21 used to form a vertical field-effect transistor using the fin 10 and a fuse region 23 on the substrate 14 used to form a vertical electrical fuse.

The fin 10 and the pillars 11, 12, 13 may originate from an epitaxial layer of undoped (e.g., intrinsic) semiconductor material deposited on the doped semiconductor layer comprising regions 18, 20 by an epitaxial growth process. The fin 10 and the pillars 11, 12, 13 may be formed from the epitaxial layer by patterning the undoped semiconductor material using photolithography and etching. The pillars 11, 12, 13 may be nanowires that are shaped as tubes, rods, or other elongated cylindrical structures having a width on the order of tens of nanometers, or less, and a length along a major axis that is larger than the width. The fin 10 has a different geometrical shape than the pillars 11, 12, 13 and may be a cuboid that includes rectangular surfaces. Generally, the cross-sectional area of the fin 10 is larger than the cross-sectional area of the pillars 11, 12, 13 in a vertical direction, and the fin 10 may have a length-to-width ratio that is greater than three (3), whereas the length-to-width ratio of the pillars 11, 12, 13 is on the order of unity. The embodiments of the invention will be described hereinbelow in the context of forming a vertical electrical fuse using one of the pillars 12, as shown in FIG. 2, with an understanding that the description applies equally to each of the pillars 11, 12, 13.

With reference to FIG. 3 in which like reference numerals refer to like features in FIG. 2 and at a subsequent fabrication stage, a bottom spacer layer 24 is formed in sections on respective top surfaces of the regions 18, 20 of the doped semiconductor layer after the fin 10 and the pillar 12 are formed. The spacer layer 24 may be comprised of a dielectric material, such as silicon nitride ($Si_3N_4$) or silicon dioxide ($SiO_2$), that is deposited by a directional deposition technique, such as gas cluster ion beam (GCIB) deposition or high-density plasma (HDP) deposition. The fin 10 and the pillar 12 penetrate through the thickness of the spacer layer 24 with only a fraction of their respective lengths covered by the spacer layer 24 at their respective bases.

A dummy gate structure 26 is formed on a top surface of the bottom spacer layer 24 and is separated from the region 18 of the doped semiconductor layer by a section of the spacer layer 24. The dummy gate structure 26 is wrapped about the exterior of the fin 10 and is located along the height of the fin 10 in a spaced relationship with the region 18 of the doped semiconductor layer serving as a bottom source/drain region of a vertical-transport transistor. A vertical channel 25 is defined in a portion of the fin 10 at the location of overlap by the dummy gate structure 26.

A dummy gate structure 28 is also formed on the top surface of the bottom spacer layer 24 and is separated from the region 20 of the doped semiconductor layer by another section of the spacer layer 24. The dummy gate structure 28 is wrapped about the exterior of the pillar 12 and is located along the height of the pillar 12 in a vertically spaced relationship with the region 20 of the doped semiconductor layer serving as an electrode of a vertical fuse.

The dummy gate structures 26, 28 may be concurrently formed by common processes and may be comprised of a sacrificial material, such as polysilicon. Sections of a dielectric layer (not shown), such as silicon dioxide ($SiO_2$), may be formed between the dummy gate structure 26 and the exterior surface of the fin 10, and between the dummy gate structure 28 and the exterior surface of the pillar 12.

A top spacer layer 30 is formed in sections on the respective top surfaces of the dummy gate structures 26, 28. The spacer layer 30 may be comprised of a dielectric material, such as silicon nitride ($Si_3N_4$) or silicon dioxide ($SiO_2$), deposited by CVD or a directional deposition technique such as GCIB. The fin 10 and the pillar 12 penetrate through the thickness of the spacer layer 30 with only a fraction of their respective lengths covered at their respective bases. The dummy gate structures 26, 28 are located vertically between the bottom spacer layer 24 and the top spacer layer 30.

A region 32 of a doped semiconductor layer is located on a section of the spacer layer 30 above the fin 10 and is coupled with a top surface of the fin 10. A region 34 of a doped semiconductor layer is located on another section of the spacer layer 30 and is coupled with one end of the pillar 12. The region of the doped semiconductor layer may function as a top source/drain region of a vertical-transport field-effect transistor to be formed using the fin 10, and the region 34 of the doped semiconductor layer may function as a portion of an electrode of a vertical fuse formed using the pillar 12.

The regions 32, 34 of the doped semiconductor layers may be formed from an epitaxial layer of semiconductor material deposited by an epitaxial growth process with in-situ doping, and may include a concentration of an n-type dopant from Group V of the Periodic Table (e.g., phosphorus (P) or arsenic (As)) that is effective to impart n-type electrical conductivity. Alternatively, the semiconductor material of the doped semiconductor layer comprising its regions 32, 34 may include a concentration of a p-type dopant selected from Group III of the Periodic Table (e.g., boron (B)) that is effective to impart p-channel conductivity. The regions 32, 34 of the doped semiconductor layer are doped to have the same conductivity type as the regions 18, 20 of the doped semiconductor layers.

The spacer layer 24, the dummy gate structures 26, 28, the spacer layer 30, and the regions 32, 34 of the doped semiconductor layer may be formed by depositing a layer stack of their constituent materials and performing a masked etch with one or more etch chemistries that are selected to pattern the layer stack with portions preserved locally at the fin 10 and locally at the pillar 12. The dummy gate structures 26, 28 are concurrently formed by the same deposition and etching processes, and are composed of the same material(s). Likewise, the regions 32, 34 of the upper doped semiconductor layer are concurrently formed by the same deposition and etching processes, and are composed of the same material. Similarly, the spacer layers 24, 30 are concurrently formed by the same deposition and etching processes, and are composed of the same material.

An annealing process may be performed to cause dopant diffusion from the region 18 of the doped semiconductor layer and the region 32 of the doped semiconductor layer respectively into top and bottom sections of the fin 10 to form source/drain extensions (not shown) near the opposite ends of the fin 10. The vertical channel 25 is preserved as a section of undoped semiconductor material between these source/drain extensions. Dopant will also diffuse from the region 20 of the doped semiconductor layer and the region 34 of the doped semiconductor layer into the top and bottom ends of the pillar 12. The difference in the processes to this junction in the processing method is that the transistor region 21 includes a fin 10 as the core structure about which the other structural elements are fabricated and the fuse region 23 includes a pillar 12 as the core structure about which the other structural elements are fabricated.

Figure 4:
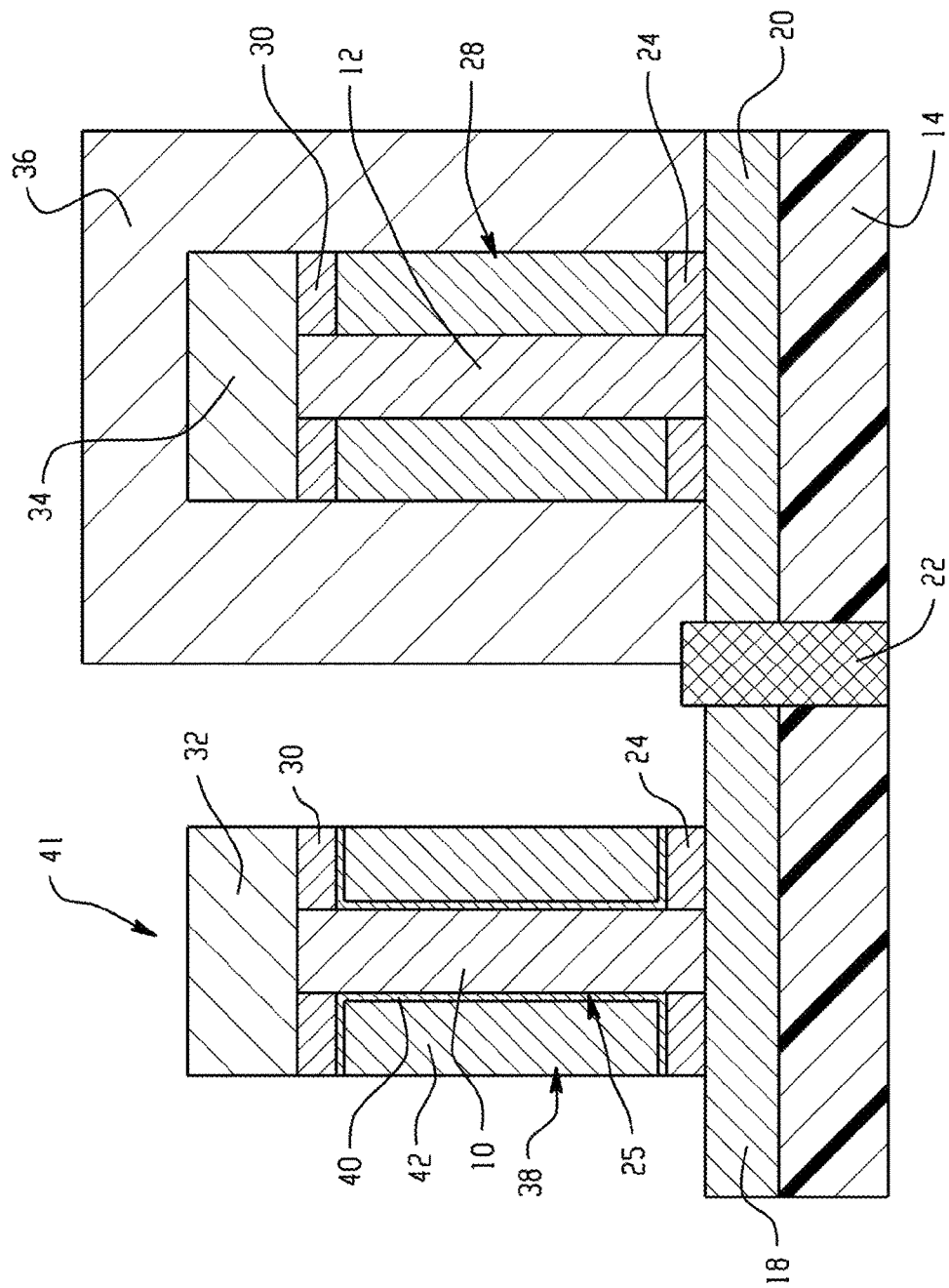

With reference to FIG. 4 in which like reference numerals refer to like features in FIG. 3 and at a subsequent fabrication stage, a patterned mask 36 is applied to cover the fuse region 23 and that exposes the transistor region 21. The patterned mask 36 may be comprised of a patterned layer of amorphous carbon that is readily removed following use. With the patterned mask 36 present, the dummy gate structure 26 may be removed by, for example, a wet chemical etch process and replaced by a functional gate structure, generally indicated by reference numeral 38, to complete the formation of a vertical-transport field-effect transistor that is generally indicated by reference numeral 41. The gate structure 38 includes a gate dielectric 40 and a gate electrode 42 that are formed in the space vacated by the dummy gate structure 26. The gate dielectric 40 may be comprised of an electrical insulator with a dielectric constant (e.g., a permittivity) characteristic of a dielectric material. For example, the gate dielectric 40 may be comprised of a high-k dielectric material such as hafnium oxide, deposited by CVD, atomic layer deposition (ALD), etc. The gate electrode 42 may be comprised of a metal deposited by CVD, ALD, etc. The vertical channel 25 is defined in a portion of the fin 10 at the location of overlap by the gate structure 38. In an embodiment, the gate structure 38 may extend about the entire perimeter of the portion of the fin 10 in a gate-all-around design. Due to protection during etching by the patterned mask 36, the dummy gate structure 28 is preserved in the fuse region 23.

Figure 5:
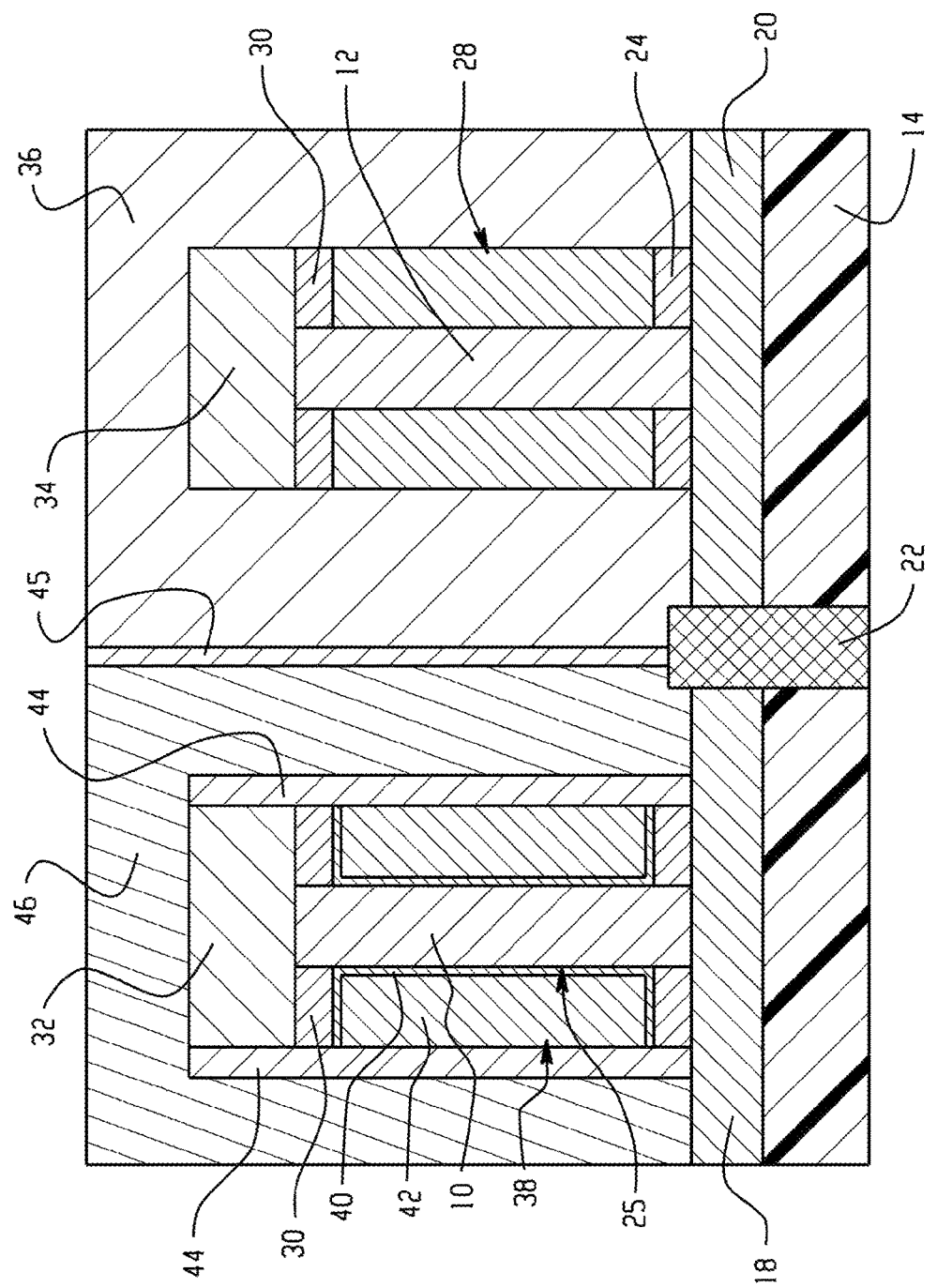

With reference to FIG. 5 in which like reference numerals refer to like features in FIG. 4 and at a subsequent fabrication stage, spacers 44 are formed on the vertical surfaces of the vertical-transport field-effect transistor 41, and function to seal the gate structure 38. The spacers 44 may be formed by depositing a conformal layer comprised of a dielectric material, such as silicon nitride ($Si_3N_4$) deposited by chemical vapor deposition, and shaping the conformal layer with an anisotropic etching process, such as reactive ion etching (ME), that preferentially removes the dielectric material from horizontal surfaces. An additional spacer 45 may be formed concurrently on the side surface of the patterned mask 36.

A dielectric layer 46 may be deposited and planarized to complete the encapsulation of the vertical-transport field-effect transistor 41. The dielectric material comprising the dielectric layer 46 may be an oxide of silicon (e.g., silicon dioxide ($SiO_2$)) or another electrical insulator deposited by CVD, and planarized using, for example, CMP. A nitride liner (not shown) may be formed before the dielectric layer 46 is formed.

Figure 6:
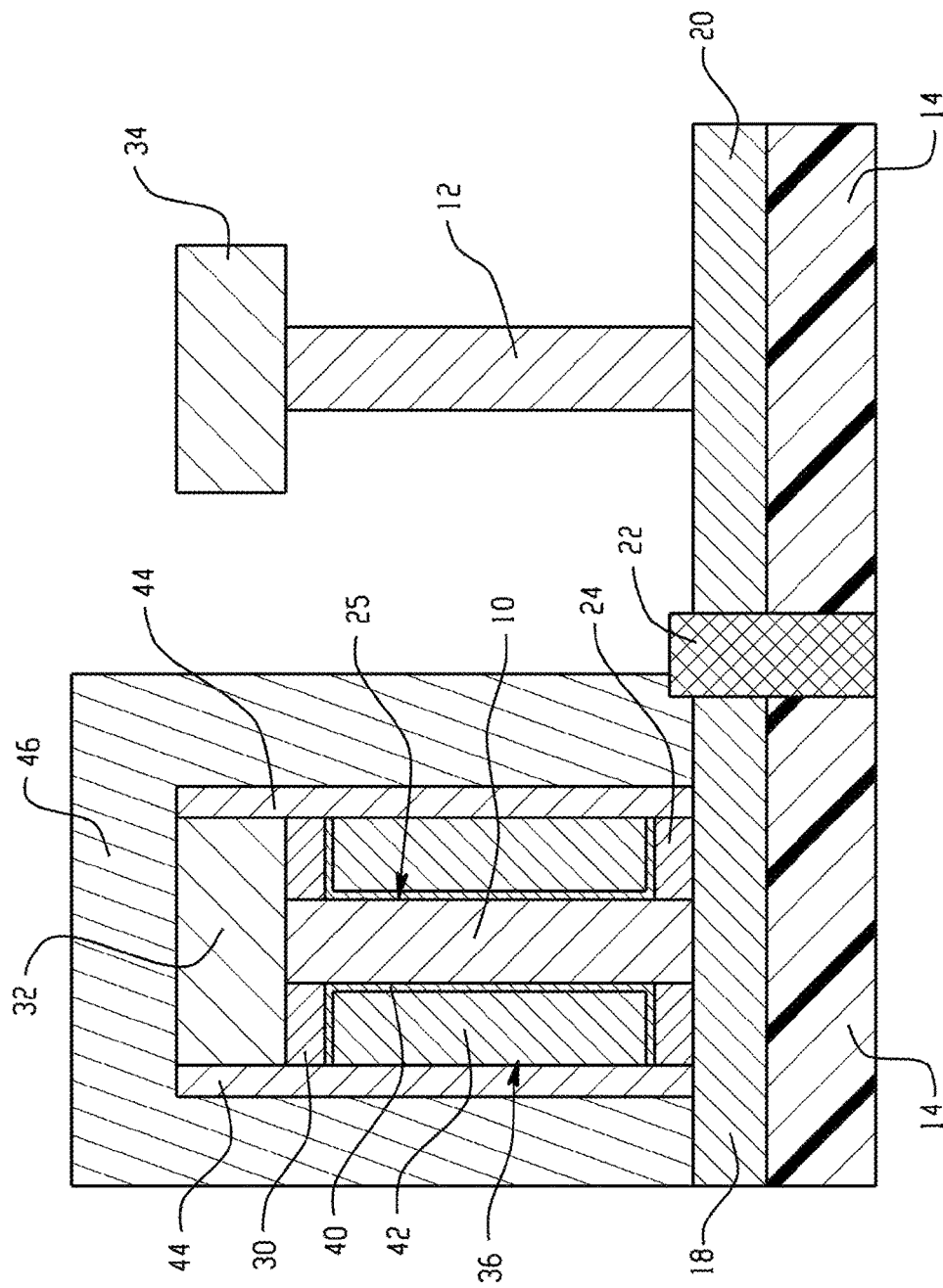

With reference to FIG. 6 in which like reference numerals refer to like features in FIG. 5 and at a subsequent fabrication stage, the patterned mask 36 may be stripped selective to the material constituting the dielectric layer 46 to open the fuse region 23. The spacer 45 may be optionally removed by, for example, a wet chemical etch process. The dummy gate structure 28 and the spacer layers 24, 30 may be removed from the pillar 12 by, for example, one or more wet chemical etch processes. The dielectric layer 46 protects the vertical-transport field-effect transistor 41 during the removal of the dummy gate structure 28 and spacer layers 24, 30 from the pillar 12. After the dummy gate structure 28 and the spacer layers 24, 30 are removed, the dielectric layer 46 may be removed by, for example, a wet chemical etch process in order to open the transistor region 21.

Figure 7:
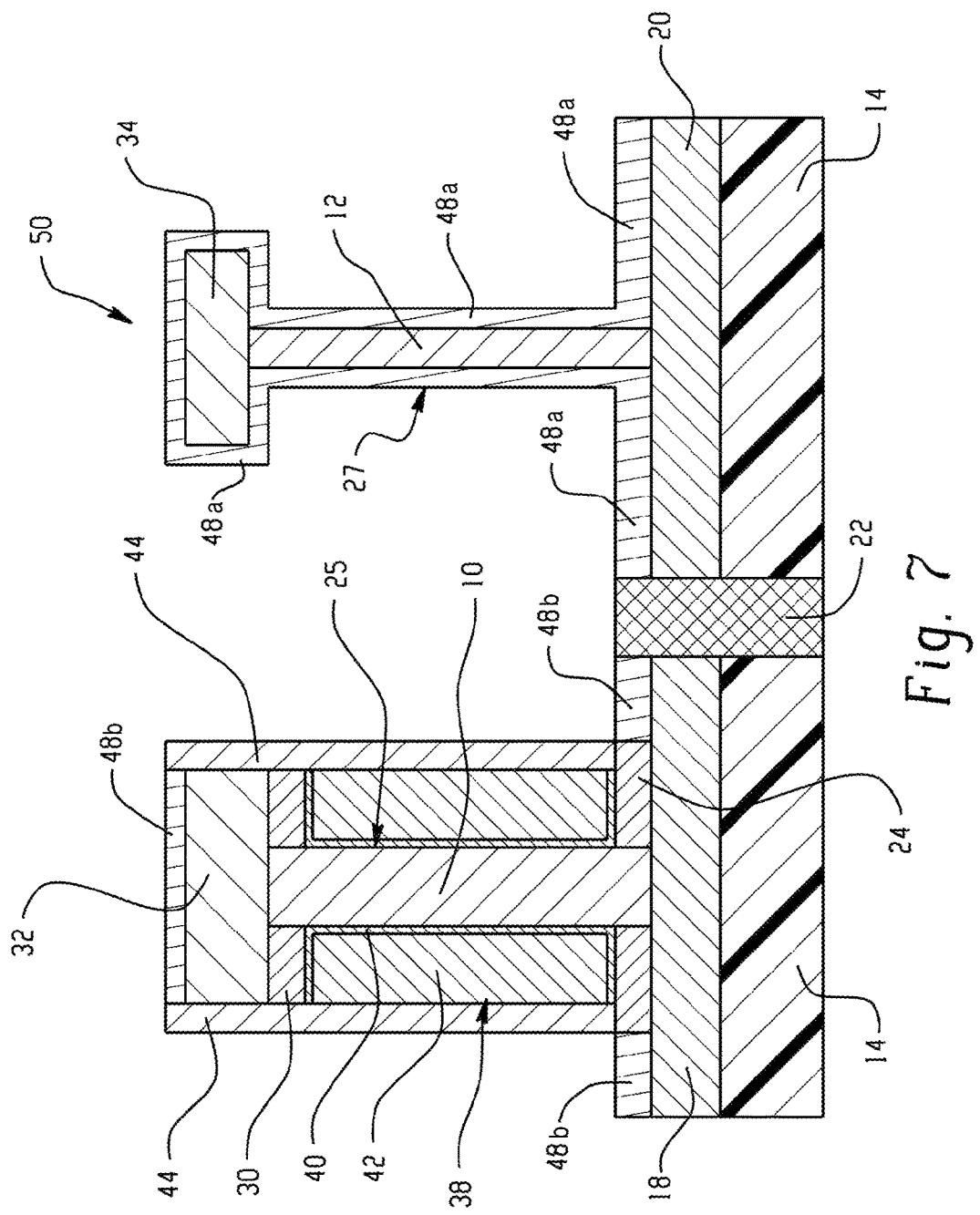

With reference to FIG. 7 in which like reference numerals refer to like features in FIG. 6 and at a subsequent fabrication stage, an electrically-conductive layer 48b is located in sections on the exposed surfaces of the region 18 of the doped semiconductor layer and the region 32 of the other doped semiconductor layer that represent the source/drain regions of the vertical-transport field-effect transistor 41. An electrically-conductive layer 48a is also located in electrically-continuous sections on the exterior surfaces of the region 20 of the doped semiconductor layer, region 34 of the other doped semiconductor layer, and pillar 12 of the vertical electrical fuse 50. The electrically-conductive layers 48a, 48b do not form on surfaces composed of dielectric material. The trench isolation region 22 interrupts the continuity of the section of the electrically-conductive layer 48b on the region 18 of the doped semiconductor layer and the section of the electrically-conductive layer 48a on region 20 of the other doped semiconductor layer. The spacers 44 interrupt the continuity of the section of the electrically-conductive layer 48b on region 18 of the doped semiconductor layer and the section of the electrically-conductive layer 48b on the region 32 of the other doped semiconductor layer.

In an embodiment, the electrically-conductive layers 48a, 48b may be constituted by a silicide that is formed by a silicidation process involving depositing a conformal layer of a silicide-forming metal, followed by one or more annealing steps to form a silicide phase by reacting the layer of silicide-forming metal and the semiconductor material (e.g., silicon) of the fin 10, pillar 12, the regions 18, 20 of the doped semiconductor layer, and the regions 32, 34 of the other doped semiconductor layers that are in a contacting relationship with the silicide-forming metal. The silicide-forming metal in contact with dielectric material, such as trench isolation region 22 and spacers 44, does not react with the dielectric material. Candidate materials for the silicide-forming metal include, but are not limited to, titanium (Ti), cobalt (Co), nickel (Ni), or another metal capable of reacting with silicon to form a low-resistivity, thermally-stable silicide. The silicide-forming metal may be deposited by, for example, a CVD process or a physical vapor deposition (PVD) process. Before annealing, a capping layer comprised of a metal nitride, such as sputter-deposited titanium nitride (TiN), may be applied to cap the silicide-forming metal. An initial annealing step of the silicidation process may form a metal-rich silicide that consumes the silicide-forming metal and then form silicides of lower metal content that grow by consuming the metal-rich silicides. Following the initial annealing step, any remaining silicide-forming metal and the optional capping layer may be removed by wet chemical etching. The silicide layer may then be subjected to an additional annealing step at a higher temperature to form a lower-resistance silicide phase.

The region 20 of the doped semiconductor layer and the section of electrically-conductive layer 48a located on the region 20 of the lower doped semiconductor layer may collectively constitute an electrode of a vertical electrical fuse 50. The region 34 of the upper doped semiconductor layer and the section of electrically-conductive layer 48a located on the region 34 of the doped semiconductor layer may constitute another electrode of the vertical electrical fuse 50. The section of the electrically-conductive layer 48a on the pillar 12 and the pillar 12 may constitute a fuse link 27 of the vertical electrical fuse 50. The pillar 12 constitutes a core of the fuse link 27 and the section of the electrically-conductive layer 48a on the pillar 12 constitutes a surface layer characterized by a higher electrical conductivity than the core. The fuse link 27 is smaller in cross-section area than the anode or cathode, which operates to increase current density and temperature in the fuse link.

Figure 8:
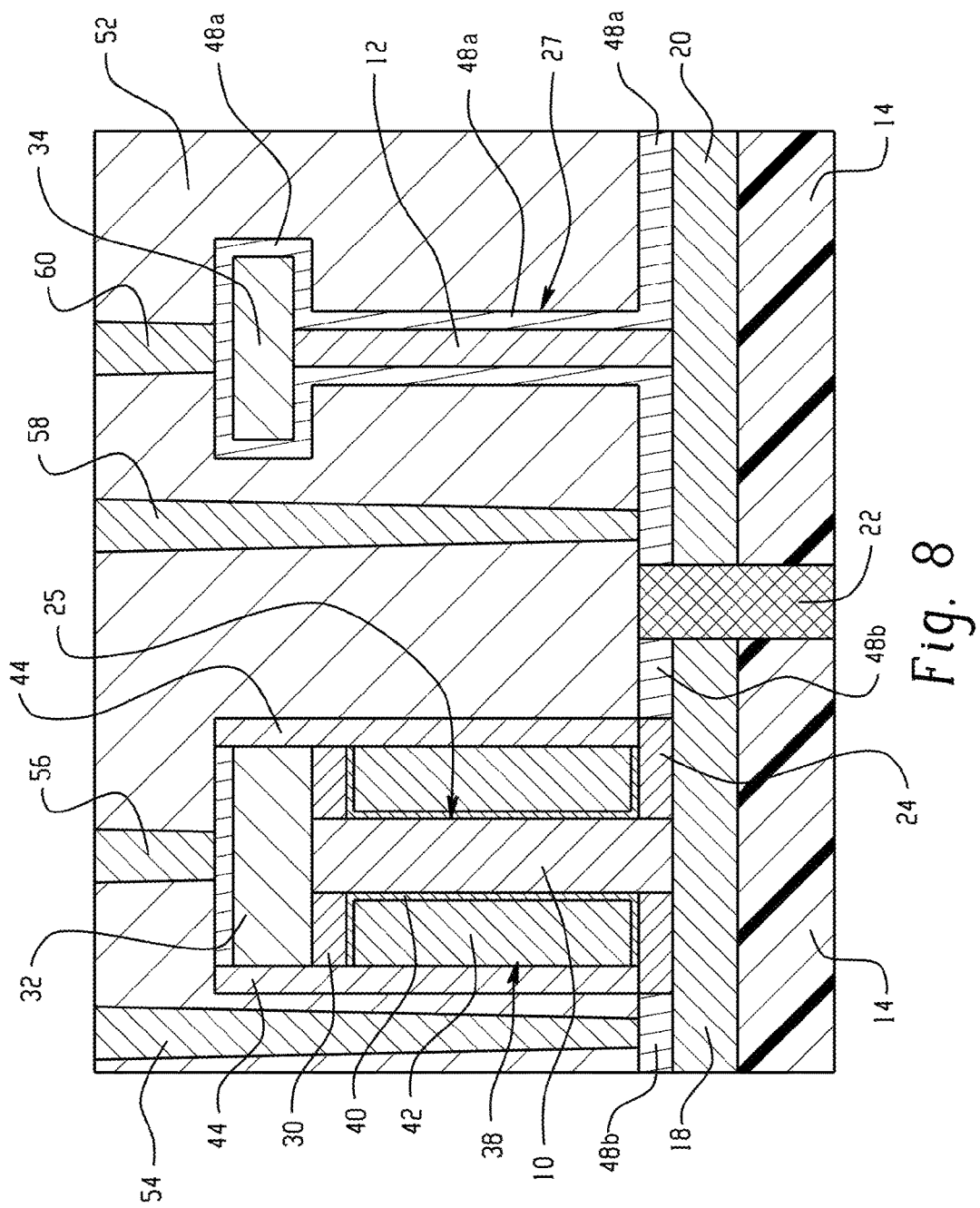

With reference to FIG. 8 in which like reference numerals refer to like features in FIG. 7 and at a subsequent fabrication stage, middle-of-line (MOL) processing, which includes formation of a dielectric layer 52, contacts 54, 56, 58, 60, and wiring (not shown), follows to define a local interconnect structure. Candidate inorganic dielectric materials for the dielectric layer 52 may include, but are not limited to, silicon dioxide ($SiO_2$), silicon nitride ($Si_3N_4$), and combinations of these and other dielectric materials. Dielectric layer 52 may be deposited by any number of techniques, such as sputtering, spin-on application, or CVD. The contacts 54, 56, 58, 60 may be formed from a conductor, such as a metal like tungsten (W), and may be clad with a conductive liner (e.g., titanium nitride (TiN)). The contacts 54, 56 for the vertical-transport field-effect transistor 41 may be concurrently formed by the same MOL processing as the contacts 58, 60 for the vertical electrical fuse 50.

Contact 54 extends through the dielectric layer 52 to contact the section of electrically-conductive layer 48b on the region 18 of the doped semiconductor layer constituting the bottom source/drain region of the vertical-transport field-effect transistor 41. Contact 56 extends through the dielectric layer 52 to contact the section of electrically-conductive layer 48b on the region 32 of the doped semiconductor layer constituting the top source/drain region of the vertical-transport field-effect transistor 41. Contact 58 extends through the dielectric layer 52 to contact the section of electrically-conductive layer 48a on the region 20 of the doped semiconductor layer serving as an electrode of the vertical electrical fuse 50. Contact 60 extends through the dielectric layer 52 to contact the section of electrically-conductive layer 48a on the region 34 of the doped semiconductor layer serving as an electrode of the vertical electrical fuse 50.

The vertical-transport field-effect transistor 41 and the vertical electrical fuse 50 are integrated into the same integrated circuit. Several processes are shared when fabricating the vertical-transport field-effect transistor 41 and the vertical electrical fuse 50 with a difference being that the vertical-transport field-effect transistor 41 is formed using fin 10 and the vertical electrical fuse 50 is formed using pillar 12 that has a different geometrical shape than the fin 10.

Back-end-of-line (BEOL) processing follows, which includes formation of dielectric layers, via plugs, and wiring for an interconnect structure coupled by the local interconnect structure with the vertical electrical fuse 50 and the vertical-transport field-effect transistor 41, as well as other similar contacts for additional device structures like the vertical electrical fuse 50 and the vertical-transport field-effect transistor 41.

The vertical electrical fuse 50 may be programmed by applying a bias potential between a lower electrode represented by the region 20 of the doped semiconductor layer and an upper electrode represented by the region 34 of the other doped semiconductor layer. The identity of the anode and the cathode may be swapped contingent upon the polarity of the bias potential applied to the vertical electrical fuse 50 during programming. The bias potential may be applied in a pulse train or as a single pulse of a lengthier duration. Electrical current of relatively high density flows vertically through the fuse link 27 associated with the pillar 12 and the section of the electrically-conductive layer 48a on the pillar 12 between the electrodes. As electrical current flows through the fuse link 27, the temperature of the fuse link 27 is elevated by Joule heating. The elevated temperature combined with the high current density promotes electromigration of the conductive material of the section of the electrically-conductive layer 48 on the pillar 12 and/or the pillar 12. The result is that the fuse link 27 physically changes from a low resistance state, when intact and prior to programming, to a high resistance state after programming.

When programmed, the programming current flows in a vertical direction through the fuse link 27 between the anode and cathode of the vertical electrical fuse 50. Similarly, in operation, the gated current in the vertical channel 25 of the fin 10 flows vertically between the bottom and top source/drain regions of the vertical-transport field-effect transistor 41. Consequently, the vertical direction of the current in the fuse link 27 is aligned parallel with the vertical direction of the current in the vertical channel 25 of the fin 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a vertical-transport field-effect transistor including a fin, a gate structure overlapping a portion of the fin that functions as a channel, a first source/drain region, and a second source/drain region, the gate structure arranged in a vertical direction between the first source/drain region and the second source/drain region; and
   a vertical electrical fuse including a fuse link, a first electrode, and a second electrode connected by the fuse link with the first electrode, the fuse link including a core comprised of a semiconductor material and a first section of a first silicide layer located on an exterior surface of the core, and the core is arranged in the vertical direction between the first electrode and the second electrode,
   wherein the first source/drain region is included in a first region of a first doped semiconductor layer, the first electrode is included in a second region of the first doped semiconductor layer, the second electrode includes a second doped semiconductor layer and a second section of the first silicide layer on the second doped semiconductor layer, and the first section and the second section of the first silicide layer are electrically continuous.

2. The structure of claim 1 wherein the core of the fuse link is a pillar comprised of the semiconductor material.

3. The structure of claim 2 wherein the fin has a first length-to-width ratio that is greater than three, and the pillar has a second length-to-width ratio that is about unity.

4. The structure of claim 1 wherein the core of the fuse link is a nanowire comprised of the semiconductor material.

5. The structure of claim 1 wherein the core is smaller in cross-sectional area than the fin in a plane normal to the vertical direction.

6. The structure of claim 1 wherein the first silicide layer includes a third section on a surface of the first region of the first doped semiconductor layer, the third section of the first silicide layer is electrically continuous with the first section and the second section of the first silicide layer, and further comprising:
   a trench isolation region between the first region of the first doped semiconductor layer and the second region of the first doped semiconductor layer; and
   a second silicide layer having a first section on the first source/drain region and a second section on the second source/drain region,
   wherein the trench isolation region is positioned to interrupt continuity of the third section of the first silicide layer and the first section of the second silicide layer.

7. The structure of claim 1 wherein the first silicide layer includes a third section on a surface of the second region of the first doped semiconductor layer, and the third section of the first silicide layer is electrically continuous with the first section and the second section of the first silicide layer.

8. The structure of claim 7 wherein the first section of the first silicide layer is located directly on the exterior surface of the core, the second section of the first silicide layer is located directly on an exterior surface of the second doped semiconductor layer, and the third section of the first silicide layer is located directly on the surface of the second region of the first doped semiconductor layer.

9. The structure of claim 1 wherein the first section of the first silicide layer is located directly on the exterior surface of the core, and the second section of the first silicide layer is located directly on an exterior surface of the second doped semiconductor layer.

10. The structure of claim 1 wherein the second region of the first doped semiconductor layer is arranged on a substrate, and the core is arranged in the vertical direction between the second region of the first doped semiconductor layer and the second doped semiconductor layer.

11. A method comprising:
   forming a first doped semiconductor layer with a first region that includes a first electrode of a vertical electrical fuse and a second region that includes a first source/drain region of a vertical-transport field effect transistor;
   forming a fin on the first region of the first doped semiconductor layer;
   forming a core of a fuse link on the second region of the first doped semiconductor layer;
   forming a second doped semiconductor layer over the core to define a second electrode of the vertical electrical fuse;
   forming a first section of a first silicide layer by a silicidation process on an exterior surface of the core and a second section of the first silicide layer by the silicidation process on the second doped semiconductor layer;
   forming a gate structure that overlaps a portion of the fin that functions as a channel, and
   forming a second source/drain region coupled with the fin,
   wherein the core of the fuse link is comprised of a semiconductor material, the gate structure is arranged in a vertical direction between the first source/drain region and the second source/drain region, the first section and the second section of the first silicide layer are electrically continuous, and the core of the fuse link is arranged in the vertical direction between the first electrode and the second electrode.

12. The method of claim 11 wherein the core of the fuse link is a pillar comprised of the semiconductor material.

13. The method of claim 12 wherein the pillar is smaller in cross-sectional area than the fin in a plane normal to the vertical direction.

14. The method of claim 11 further comprising:
   forming a first section of a second silicide layer on the first source/drain region; and
   forming a second section of the second silicide layer on the second source/drain region,
   wherein the first silicide layer and the second silicide layer are concurrently formed.

15. The method of claim 14 further comprising:
   forming a third section of the first silicide layer on the first electrode; and
   forming a trench isolation region in the first doped semiconductor layer that is located between the second section of the first silicide layer and the first section of the second silicide layer.

16. The method of claim 11 further comprising:
   forming a third section of the first silicide layer on the first electrode, wherein the first section, the second section, and the third section of the first silicide layer are electrically continuous.

17. The method of claim 11 wherein the first silicide layer has a higher electrical conductivity than the semiconductor material of the core.

18. The method of claim 11 wherein the core of the fuse link is a nanowire comprised of the semiconductor material, and the nanowire and the fin are concurrently formed.

19. The method of claim 11 wherein the first electrode is a cathode of the vertical electrical fuse, and the second electrode is an anode of the vertical electrical fuse.

20. The method of claim 11 further comprising:
   forming a trench isolation region in the first doped semiconductor layer that is located between the first region of the first doped semiconductor layer and the second region of the first doped semiconductor layer.

* * * * *